(12) United States Patent
Park

(10) Patent No.: US 12,340,848 B2
(45) Date of Patent: Jun. 24, 2025

(54) MEMORY DEVICE AND OPERATING METHOD THEREOF

(71) Applicant: SK hynix Inc., Gyeonggi-do (KR)

(72) Inventor: Cheol Joong Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 284 days.

(21) Appl. No.: 17/883,719

(22) Filed: Aug. 9, 2022

(65) Prior Publication Data

US 2023/0298670 A1 Sep. 21, 2023

(30) Foreign Application Priority Data

Mar. 15, 2022 (KR) .................. 10-2022-0031969

(51) Int. Cl.
*G11C 16/16* (2006.01)
*G11C 16/08* (2006.01)

(52) U.S. Cl.
CPC .............. *G11C 16/16* (2013.01); *G11C 16/08* (2013.01)

(58) Field of Classification Search
CPC ..................................................... G11C 16/08
See application file for complete search history.

(56) References Cited

U.S. PATENT DOCUMENTS

2017/0372786 A1* 12/2017 Lee ...................... G06F 1/3275

FOREIGN PATENT DOCUMENTS

| KR | 10-2015-0059499 A | 6/2015 |
|---|---|---|
| KR | 10-1997912 B1 | 7/2019 |

* cited by examiner

*Primary Examiner* — Jason Lappas
(74) *Attorney, Agent, or Firm* — IP & T GROUP LLP

(57) ABSTRACT

A memory device includes a target memory block and a peripheral circuit configured to float local word lines which are coupled to the target memory block while an erase voltage rises toward a target level, apply a first voltage to the local word lines after the erase voltage reaches the target level, and apply one or more group voltages to the local word lines after applying the first voltage.

15 Claims, 6 Drawing Sheets

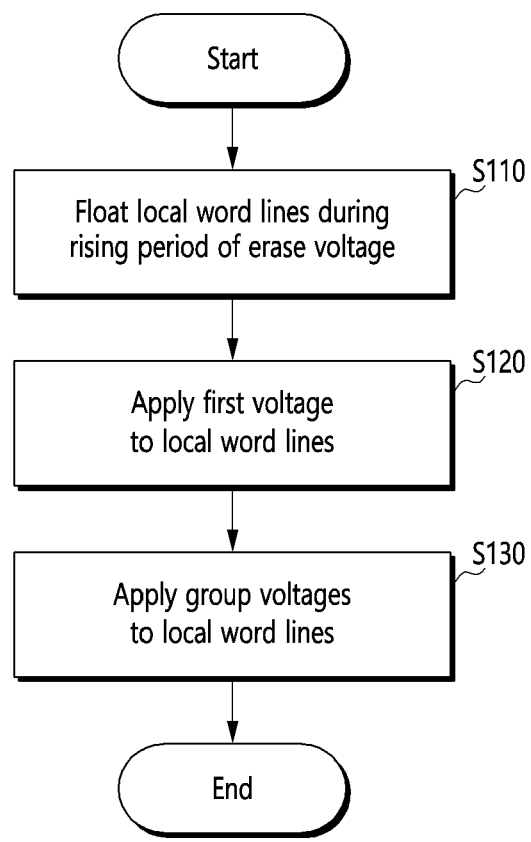

MEMORY DEVICE AND OPERATING METHOD THEREOF

CROSS-REFERENCES TO RELATED APPLICATION

The present application claims priority under 35 U.S.C. § 119(a) to Korean patent application number 10-2022-0031969, filed on Mar. 15, 2022, which is incorporated herein by reference in its entirety.

BACKGROUND

1. Technical Field

Various embodiments of the present disclosure generally relate to a semiconductor device, and, more particularly, to a memory device.

2. Related Art

Memory devices may include a volatile memory device which loses data stored therein when the power supply is cut off and a nonvolatile memory device which maintains data stored therein even when the power supply is cut off.

The volatile memory device may include a DRAM (dynamic random access memory) and an SRAM (static random access memory). The nonvolatile memory device may include a ROM (read only memory), a PROM (programmable ROM), an EPROM (electrically programmable ROM), an EEPROM (electrically erasable and programmable ROM) and a NAND flash.

A memory device may include a plurality of memory cells, and may be configured to perform a program operation, a read operation and an erase operation on the memory cells. The memory device may interrupt an internal operation being performed, perform another operation first and then resume the interrupted internal operation, according to external control.

SUMMARY

Various embodiments of the present disclosure are directed to a memory device and an operating method thereof, capable of stably performing an erase operation.

In an embodiment of the present disclosure, a memory device may include: a target memory block; and a peripheral circuit configured to float local word lines which are coupled to the target memory block while an erase voltage rises toward a target level, apply a first voltage to the local word lines after the erase voltage reaches the target level, and apply one or more group voltages to the local word lines after applying the first voltage.

In an embodiment of the present disclosure, a memory device may include: a voltage supply circuit configured to supply one or more group voltages and a first voltage; and a decoder configured to, while performing an erase operation on a target memory block: apply the first voltage to local word lines which are coupled to the target memory block, and apply the one or more group voltages to the local word lines after applying the first voltage.

In an embodiment of the present disclosure, a method for operating a memory device may include: floating local word lines which are coupled to a target memory block, during a rising period of an erase voltage; applying a first voltage to the local word lines after the rising period; and applying one or more group voltages to the local word lines after applying the first voltage.

In an embodiment of the present disclosure, an operating method of a memory device may include: applying an erase voltage to a memory block; floating a local word line coupled to the memory block while the applied erase voltage is increasing to reach a target voltage; and applying, after the applied erase voltage reaches the target voltage, a third voltage and then a fourth voltage to the local word line. The floating may include turning on a switch with a first voltage to couple a global word line to the local word line; and applying a second voltage to the global word line. The first voltage may be lower than the second voltage, the third voltage may be lower than the first voltage, and the fourth voltage may be lower than the third voltage.

The memory device and the operating method thereof according to the embodiments of the present disclosure may stably perform an erase operation.

BRIEF DESCRIPTION OF THE DRAWINGS

FIG. 6 is a flowchart illustrating a method for a memory device to perform an erase operation in accordance with an embodiment of the present disclosure.

DETAILED DESCRIPTION

Figure 1:
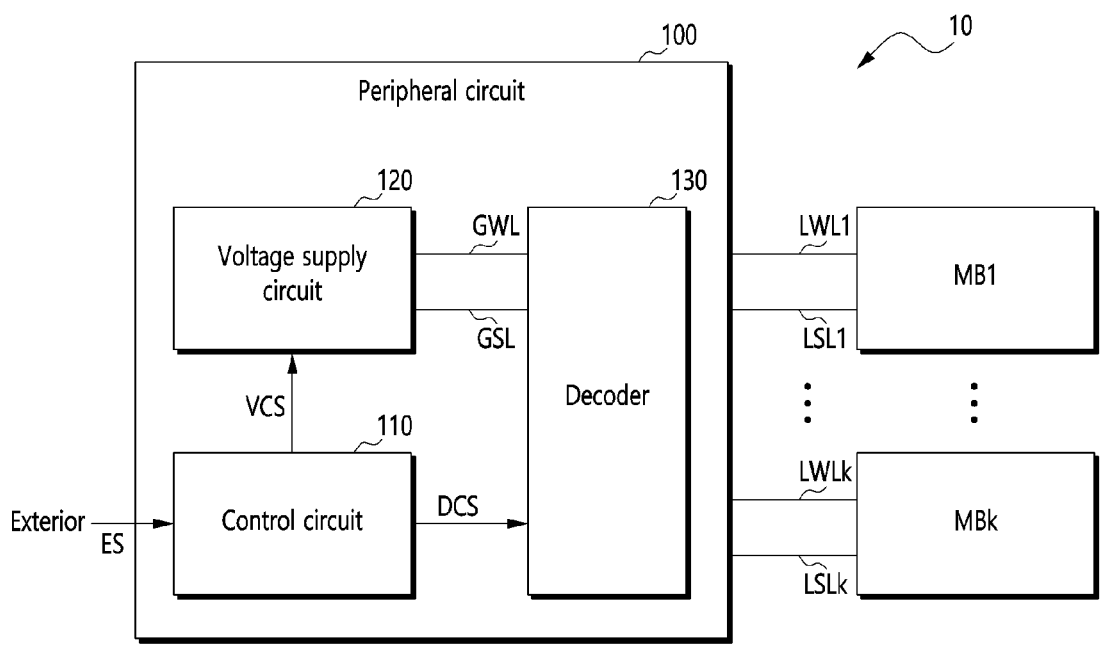
FIG. 1 is a block diagram illustrating a memory device in accordance with an embodiment of the present disclosure.

In the present disclosure, advantages, features and methods for achieving them will become more apparent after a reading of the following embodiments taken in conjunction with the accompanying drawings. The present disclosure may, however, be embodied in different forms and should not be construed as being limited to the embodiments set forth herein. Rather, these embodiments are provided to describe the present disclosure in detail to the extent that a person skilled in the art to which the disclosure pertains can easily carry out the technical ideas of the present disclosure.

It is to be understood herein that embodiments of the present disclosure are not limited to the particulars shown in the drawings and that the drawings are not necessarily to scale and in some instances proportions may have been exaggerated in order to more clearly depict certain features of the disclosure. While particular terminology is used herein, it is to be appreciated that the terminology used herein is for the purpose of describing particular embodiments only and is not intended to limit the scope of the present disclosure.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, embodiments of the present disclosure will be described in detail with reference to the accompanying drawings.

FIG. 1 is a block diagram illustrating a memory device 10 in accordance with an embodiment of the present disclosure.

Referring to FIG. 1, the memory device 10 may perform an internal operation such as a program operation, a read operation and an erase operation according to external control. The memory device 10 may receive external signals ES instructing an internal operation from an exterior. The external signals ES may include a command, an address, data and various control signals for controlling the memory device 10.

The memory device 10 may interrupt an erase operation being performed, perform another internal operation (e.g., a read operation or a program operation) first and then resume the interrupted erase operation, according to external control. Accordingly, the other internal operation that has priority over the erase operation may be quickly performed. However, if the interruption and resumption of the erase operation are repeated as other internal operations are repeatedly requested, the possibility of the occurrence of a case where memory cells are unevenly erased (i.e., some memory cells are excessively erased and some other memory cells are less erased) may increase.

The memory device 10 may include memory blocks MB1 to MBk and a peripheral circuit 100.

The memory blocks MB1 to MBk may be coupled to the peripheral circuit 100 through local word lines LWL1 to LWLk and local select lines LSL1 to LSLk. Each of the memory blocks MB1 to MBk may be coupled to the peripheral circuit 100 through corresponding local word lines and corresponding local select lines. For example, the memory block MB1 may be coupled to the peripheral circuit 100 through the local word lines LWL1 and the local select lines LSL1. Each of the local select lines LSL1 to LSLk may include a drain select line and a source select line.

A memory block may be a unit by which the memory device 10 performs an erase operation. That is, data stored in a memory block may be simultaneously erased. However, according to an embodiment, the memory device 10 may perform an erase operation in a unit smaller than memory block.

Each of the memory blocks MB1 to MBk may include a plurality of memory cells in which data are stored. The memory cells may be arranged in a two-dimensional structure in which the memory cells are arranged parallel to a substrate or a three-dimensional structure in which the memory cells are stacked on a substrate in a vertical direction.

The peripheral circuit 100 may perform an internal operation of the memory device 10 on the basis of the external signals ES.

In detail, the peripheral circuit 100 may perform an erase operation on a target memory block, for example, the memory block MB1, among the memory blocks MB1 to MBk. The peripheral circuit 100 may apply an erase voltage to the target memory block MB1. While the erase voltage rises toward a target level, that is, during a rising period of the erase voltage, the peripheral circuit 100 may float the local word lines LWL1 coupled to the target memory block MB1. After the erase voltage reaches the target level, that is, after the rising period of the erase voltage, the peripheral circuit 100 may apply a first voltage to the local word lines LWL1. After applying the first voltage to the local word lines LWL1, the peripheral circuit 100 may apply one or more group voltages to the local word lines LWL1.

According to an embodiment, the first voltage may be higher than the one or more group voltages.

According to an embodiment, the capacitance of the first voltage may be larger than the capacitance of each of the one or more group voltages. The first voltage may be a voltage which is more stably supplied than the one or more group voltages.

According to an embodiment, the one or more group voltages may correspond to respective local word line groups, into which the local word lines LWL1 are grouped. After applying the first voltage to the local word lines LWL1, the peripheral circuit 100 may apply the one or more group voltages to the respective local word line groups. The peripheral circuit 100 may sequentially apply the one or more group voltages to the one or more local word line groups.

According to an embodiment, in order to float the local word lines LWL1, the peripheral circuit 100 may apply a second voltage as a block select signal corresponding to the target memory block MB1 and may apply a third voltage to global word lines GWL which are configured to be coupled to the local word lines LWL1 in response to the block select signal. The block select signal corresponding to the target memory block MB1 may be a signal for coupling the global word lines GWL and the local word lines LWL1. The block select signal corresponding to the target memory block MB1 may be a signal which is inputted to the gates of NMOS transistors positioned between the global word lines GWL and the local word lines LWL1.

According to an embodiment, the second voltage may be lower than the third voltage.

According to an embodiment, the first voltage may be lower than the second voltage and the third voltage.

According to an embodiment, while the local word lines LWL1 are floated, the peripheral circuit 100 may float the local select lines LSL1 which are coupled to the target memory block MB1. In addition, while the first voltage is applied to the local word lines LWL1 and while the one or more group voltages are applied to the local word lines LWL1, the peripheral circuit 100 may continuously float the local select lines LSL1.

The peripheral circuit 100 may include a control circuit 110, a voltage supply circuit 120 and a decoder 130.

The control circuit 110 may control general operations of the memory device 10 on the basis of the external signals ES. The control circuit 110 may generate voltage control signals VCS on the basis of the external signals ES and output the voltage control signals VCS to the voltage supply circuit 120. The control circuit 110 may generate decoding control signals DCS on the basis of the external signals ES and output the decoding control signals DCS to the decoder 130. By controlling the voltage supply circuit 120 and the decoder 130 through the voltage control signals VCS and the decoding control signals DCS, the control circuit 110 may perform an erase operation on the target memory block MB1.

The voltage supply circuit 120 may generate and output voltages of preset levels in response to the voltage control signals VCS. In detail, the voltage supply circuit 120 may selectively supply the first voltage, the one or more group voltages and the third voltage to the global word lines GWL in the erase operation. In the erase operation, the voltage supply circuit 120 may supply the third voltage to global select lines GSL including a global drain select line and a global source select line. Furthermore, in the erase operation, the voltage supply circuit 120 may supply an erase voltage to a source line (see FIG. 4) which is coupled to the target memory block MB1. The configuration and operation of the voltage supply circuit 120 will be described later in more detail with reference to FIGS. 4 and 5.

The decoder 130 may address a memory region, on which an internal operation is to be performed among the memory blocks MB1 to MBk, in response to the decoding control signals DCS. In detail, in the erase operation, the decoder 130 may select the memory block MB1 as a target memory block among the memory blocks MB1 to MBk. In order to select the target memory block, the decoder 130 may enable the block select signal corresponding to the target memory block MB1. By enabling the block select signal corresponding to the target memory block MB1, the decoder 130 may couple the local word lines LWL1 of the target memory block MB1 to the global word lines GWL. When enabling the block select signal, the decoder 130 may apply the second voltage as the block select signal. The configuration and operation of the decoder 130 will be described later in more detail with reference to FIGS. 4 and 5.

The memory device 10 may be a nonvolatile memory device. The nonvolatile memory device may include a flash memory device such as a NAND flash or a NOR flash, an FeRAM (ferroelectric random access memory), a PCRAM (phase change random access memory), an MRAM (magnetic random access memory) or an ReRAM (resistive random access memory).

According to embodiments of the present disclosure, even when the interruption and resumption of an erase operation are repeated, the memory device 10 may prevent memory cells from being unevenly erased, by floating the local word lines LWL1 while the level of an erase voltage is rising. Moreover, before applying one or more group voltages to the local word lines LWL1 for actual erasure, by first applying a more stable first voltage to the floated local word lines LWL1, the memory device 10 may stably perform the erase operation.

Figure 2:
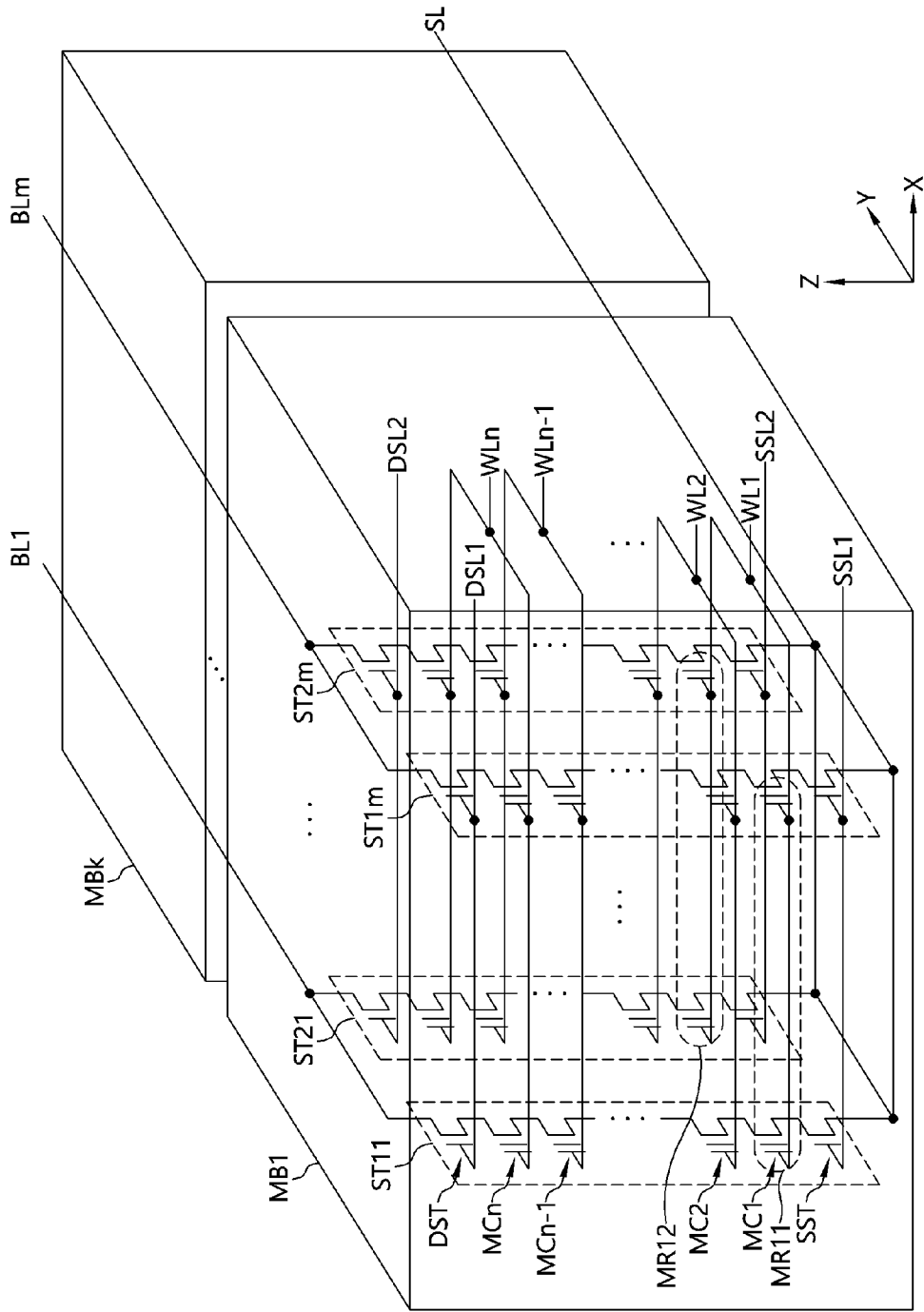
FIG. 2 is a circuit diagram illustrating a memory block in accordance with an embodiment of the present disclosure.

FIG. 2 is a circuit diagram illustrating the memory block MB1 in accordance with an embodiment of the present disclosure. Each of the other memory blocks of FIG. 1 may be configured similarly to the memory block MB1 of FIG. 2.

Referring to FIG. 2, the memory block MB1 may include strings ST11 to ST1m and ST21 to ST2m. Each of the strings ST11 to ST1m and ST21 to ST2m may extend in a vertical direction (a Z direction). In the memory block MB1, m number of strings may be arranged in a row direction (an X direction). FIG. 2 illustrates that two strings are arranged in a column direction (a Y direction). However, this is for the sake of convenience in description, and at least three strings may be arranged in the column direction (the Y direction).

The strings ST11 to ST1m and ST21 to ST2m may be configured the same. For example, the string ST11 may include a source select transistor SST, memory cells MC1 to MCn and a drain select transistor DST which are coupled in series between a source line SL and a bit line BL1. The source of the source select transistor SST may be coupled to the source line SL, and the drain of the drain select transistor DST may be coupled to the bit line BL1. The memory cells MC1 to MCn may be coupled in series between the source select transistor SST and the drain select transistor DST.

The gates of source select transistors of strings arranged in the same row may be coupled to the same source select line. For example, the gates of source select transistors of the strings ST11 to ST1m of a first row may be coupled to a source select line SSL1. The gates of source select transistors of the strings ST21 to ST2m of a second row may be coupled to a source select line SSL2. In another embodiment, source select transistors of the strings ST11 to ST1m and ST21 to ST2m may be coupled in common to one source select line.

The gates of drain select transistors of strings arranged in the same row may be coupled to the same drain select line. For example, the gates of drain select transistors of the strings ST11 to ST1m of the first row may be coupled to a drain select line DSL1. The gates of drain select transistors of the strings ST21 to ST2m of the second row may be coupled to a drain select line DSL2.

Strings arranged in the same column may be coupled to the same bit line. For example, the strings ST11 and ST21 of a first column may be coupled to the bit line BL1. The strings ST1m and ST2m of an mth column may be coupled to a bit line BLm.

The gates of memory cells which are at the same position in the vertical direction may be coupled to the same word line. For example, in the strings ST11 to ST1m and ST21 to ST2m, memory cells which are at the same position as the memory cell MC1 in the vertical direction may be coupled to a word line WL1. Word lines WL1 to WLn may correspond to the local word lines LWL1 of FIG. 1.

Among the memory cells, memory cells which are coupled to the same word line in the same row may configure a single memory region. For example, memory cells which are coupled to the word line WL1 in the first row may configure a memory region MR11. Memory cells which are coupled to the word line WL1 in the second row may configure a memory region MR12. Depending on the number of rows, each word line may be coupled to a plurality of memory regions. Memory cells which configure a single memory region may be simultaneously programmed. The single memory region may configure, for example, a page.

According to an embodiment, the memory block MB1 may be further coupled to one or more dummy word lines between the word lines WL1 to WLn and the drain select line DSL1 and/or between the word lines WL1 to WLn and the source select line SSL1. In this case, the memory block MB1 may further include dummy memory cells which are coupled to the dummy word lines.

Figure 3:
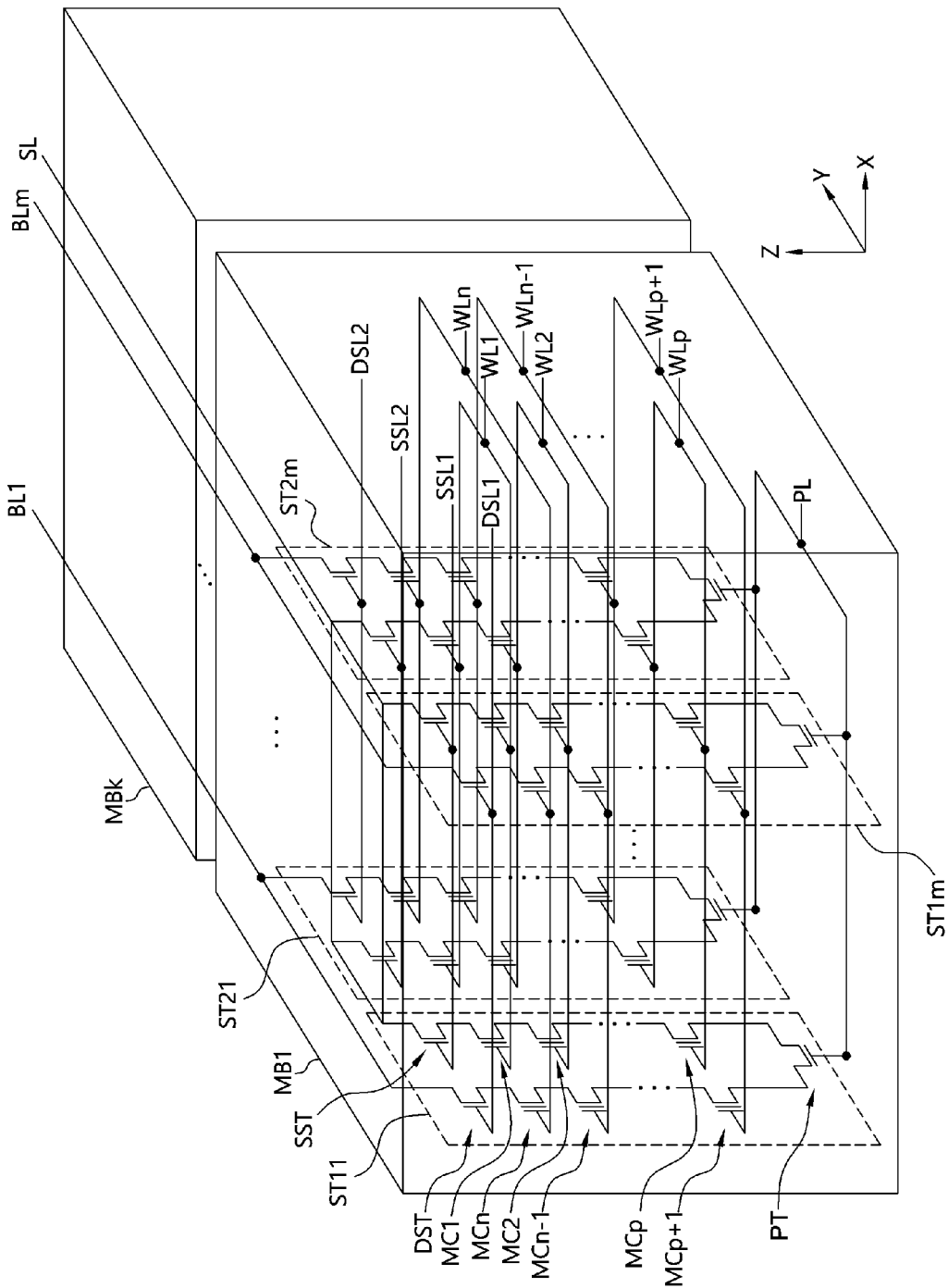
FIG. 3 is a circuit diagram illustrating a memory block in accordance with an embodiment of the present disclosure.

FIG. 3 is a circuit diagram illustrating the memory block MB1 in accordance with an embodiment of the present disclosure. Each of the other memory blocks of FIG. 1 may be configured similarly to the memory block MB1 of FIG. 3.

Referring to FIG. 3, the memory block MB1 may include a plurality of strings ST11 to ST1m and ST21 to ST2m. Each of the strings ST11 to ST1m and ST21 to ST2m of FIG. 3 may be configured and operate similarly to each of the strings ST11 to ST1m and ST21 to ST2m of FIG. 2. However, each of the strings ST11 to ST1m and ST21 to ST2m of FIG. 3 is formed in a U shape and may further include a pipe transistor PT. The gate of the pipe transistor PT may be coupled to a pipeline PL. Among memory cells MC1 to MCn, memory cells MC1 to MCp may be sequentially arranged in the reverse direction of the Z direction, and may be coupled in series between a source select transistor SST and the pipe transistor PT. Among the memory cells MC1 to MCn, memory cells MCp+1 to MCn may be sequentially arranged in the Z direction, and may be coupled in series between the pipe transistor PT and the drain select transistor DST.

Figure 4:
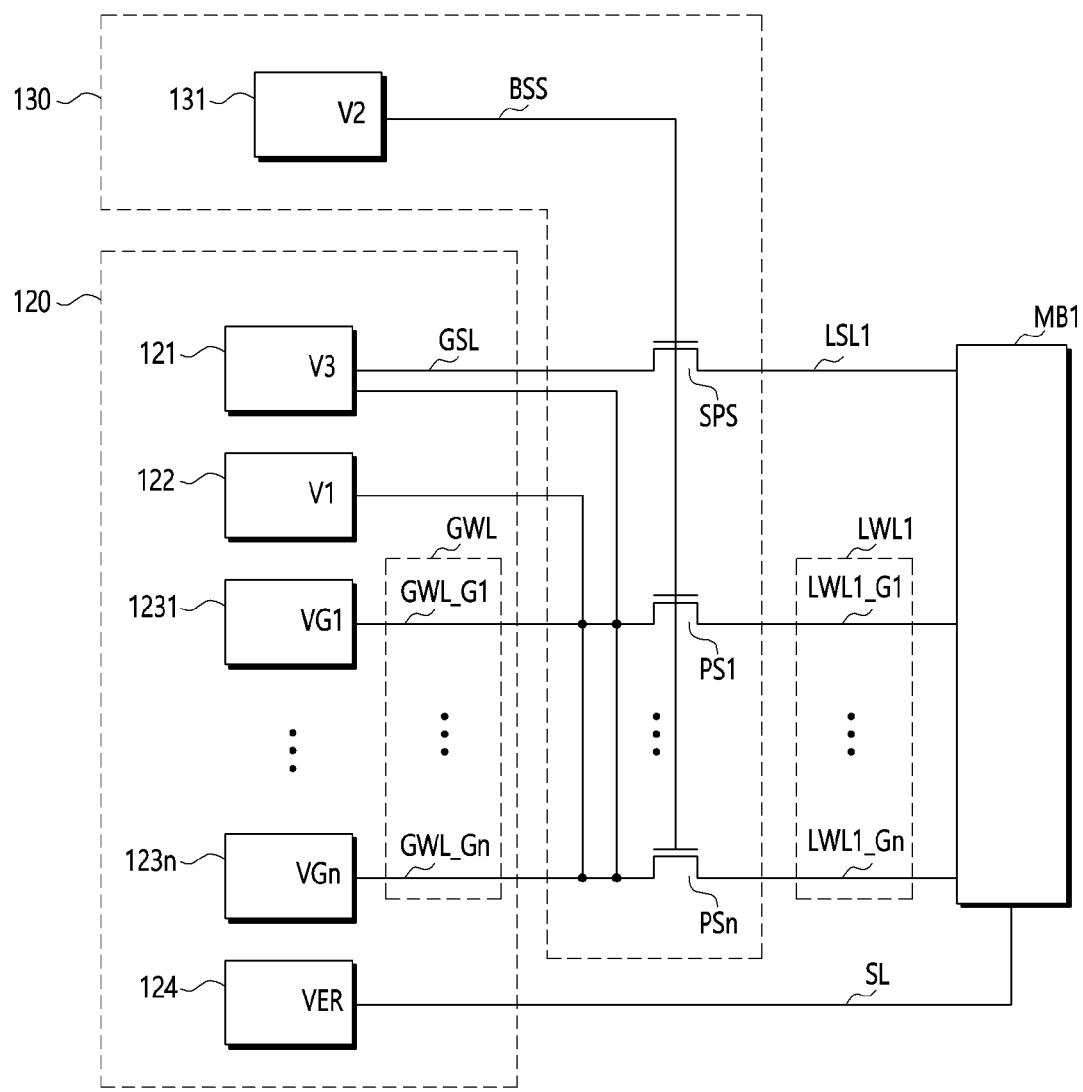
FIG. 4 is a diagram illustrating in more detail a voltage supply circuit and a decoder in accordance with an embodiment of the present disclosure.

FIG. 4 is a diagram illustrating in more detail the voltage supply circuit 120 and the decoder 130 in accordance with an embodiment of the present disclosure.

Referring to FIG. 4, the voltage supply circuit 120 may include a third voltage generation circuit 121, a first voltage generation circuit 122, first to nth group voltage generation circuits 1231 to 123n, and an erase voltage generation circuit 124. Although not illustrated, each circuit included in the voltage supply circuit 120 may operate in response to the voltage control signal VCS transmitted from the control circuit 110.

The third voltage generation circuit 121 may be coupled to the global word lines GWL and the global select lines GSL. The third voltage generation circuit 121 may supply a third voltage V3 to the global word lines GWL and the global select lines GSL. The global select lines GSL may be coupled to the local select lines LSL1 through a selective pass circuit SPS. In more detail, the global drain select line and the global source select line included in the global select lines GSL may be coupled to the drain select line DSL1 and the source select line SSL1, respectively, through the selective pass circuit SPS.

The first voltage generation circuit 122 may be coupled to the global word lines GWL. The first voltage generation circuit 122 may supply a first voltage V1 to the global word lines GWL. The first voltage V1 may be, for example, a core voltage.

The local word lines LWL1 and the global word lines GWL may be grouped according to their respective positions. The local word lines LWL1 may be grouped into first to nth local word line groups LWL1_G1 to LWL1_Gn. Each of the first to nth local word line groups LWL1_G1 to LWL1_Gn may include a predetermined number of adjacent local word lines. For example, the predetermined number of local word lines closest to a source select line SSL may be the first local word line group LWL1_G1 and the predetermined number of local word lines closest to a drain select line DSL may be the nth local word line group LWL1_Gn, but the embodiment of the present disclosure is not limited thereto. The global word lines GWL may be grouped into first to nth global word line groups GWL_G1 to GWL_Gn similarly to a method in which the local word lines LWL1 are grouped. When the global word lines GWL and the local word lines LWL1 are controlled by being grouped instead of being individually controlled, switches for individual control may be omitted, and thus, an increase in area may be suppressed.

The first to nth group voltage generation circuits 1231 to 123n may be coupled to the first to nth global word line groups GWL_G1 to GWL_Gn, respectively. The first to nth group voltage generation circuits 1231 to 123n may generate first to nth group voltages VG1 to VGn, respectively.

The first to nth group voltage generation circuits 1231 to 123n may be configured and operate in a similar manner. When the first group voltage generation circuit 1231 is described as an example, the first group voltage generation circuit 1231 may be coupled to the first global word line group GWL_G1. The first global word line group GWL_G1 may include a plurality of global word lines which may be coupled to respective local word lines included in the first local word line group LWL1_G1. The first voltage generation circuit 1231 may supply the first group voltage VG1 to the first global word line group GWL_G1. The first global word line group GWL_G1 may be coupled to the first local word line group LWL1_G1 through a first pass circuit PS1. In more detail, the plurality of global word lines included in the first global word line group GWL_G1 may be coupled to the respective local word lines included in the first local word line group LWL1_G1, through the first pass circuit PS1.

The erase voltage generation circuit 124 may be coupled to the source line SL. The erase voltage generation circuit 124 may supply an erase voltage VER to the source line SL. The erase voltage generation circuit 124 may raise the erase voltage VER to a preset target level during a rising period of the erase voltage VER.

The decoder 130 may include a block decoder 131, the selective pass circuit SPS, and first to nth pass circuits PS1 to PSn.

In an erase operation on the target memory block MB1, the block decoder 131 may apply a block select signal BSS corresponding to the target memory block MB1 to the selective pass circuit SPS and the first to nth pass circuits PS1 to PSn. The block select signal BSS may be a signal for coupling the global select lines GSL and the local select lines LSL1 and coupling the global word lines GWL and the local word lines LWL1. The block decoder 131 may apply a second voltage V2 as the block select signal BSS.

Since the second voltage V2 is lower than the third voltage V3, when the third voltage V3 is applied to the global word lines GWL in a state in which the second voltage V2 is applied as the block select signal BSS, the local word lines LWL1 may be floated. Similarly, when the third voltage V3 is applied to the global select lines GSL in the state in which the second voltage V2 is applied as the block select signal BSS, the local select lines LSL1 may be floated.

The selective pass circuit SPS may be coupled between the global select lines GSL and the local select lines LSL1. The selective pass circuit SPS may couple the global select lines GSL and the local select lines LSL1 in response to the block select signal BSS. In more detail, the selective pass circuit SPS may couple the global drain select line and the global source select line, which are included in the global select lines GSL, to the drain select line DSL1 and the source select line SSL1, respectively, included in the local select lines LSL1. As illustrated, the selective pass circuit SPS may include an NMOS transistor which is applied with the block select signal BSS through the gate thereof. However, according to an embodiment, the selective pass circuit SPS may be configured by other elements.

The first to nth pass circuits PS1 to PSn may be coupled between the first to nth global word line groups GWL_G1 to GWL_Gn and the first to nth local word line groups LWL1_G1 to LWL1_Gn, respectively. The first to nth pass circuits PS1 to PSn may couple the first to nth global word line groups GWL_G1 to GWL_Gn and the first to nth local word line groups LWL1_G1 to LWL1_Gn, respectively, in response to the block select signal BSS. The first to nth pass circuits PS1 to PSn may be configured and operate in a similar manner. When the first pass circuit PS1 is described as an example, the first pass circuit PS1 may couple the plurality of global word lines, which are included in the first global word line group GWL_G1, to the respective local word lines included in the first local word line group LWL1_G1. As illustrated, the first pass circuit PS1 may include an NMOS transistor which is applied with the block select signal BSS through the gate thereof. However, according to an embodiment, the first pass circuit PS1 may be configured by other elements.

Although not illustrated, the decoder 130 may further include pass circuits which are coupled between local word lines of another memory block other than the memory block MB1 and the global word lines GWL. Accordingly, when an erase operation is performed on another target memory block other than the memory block MB1, the block decoder 131 may enable a block select signal corresponding to the target memory block. In this case, the local word lines coupled to the target memory block may be controlled similarly as described above in response to the enabled block select signal.

Figure 5:
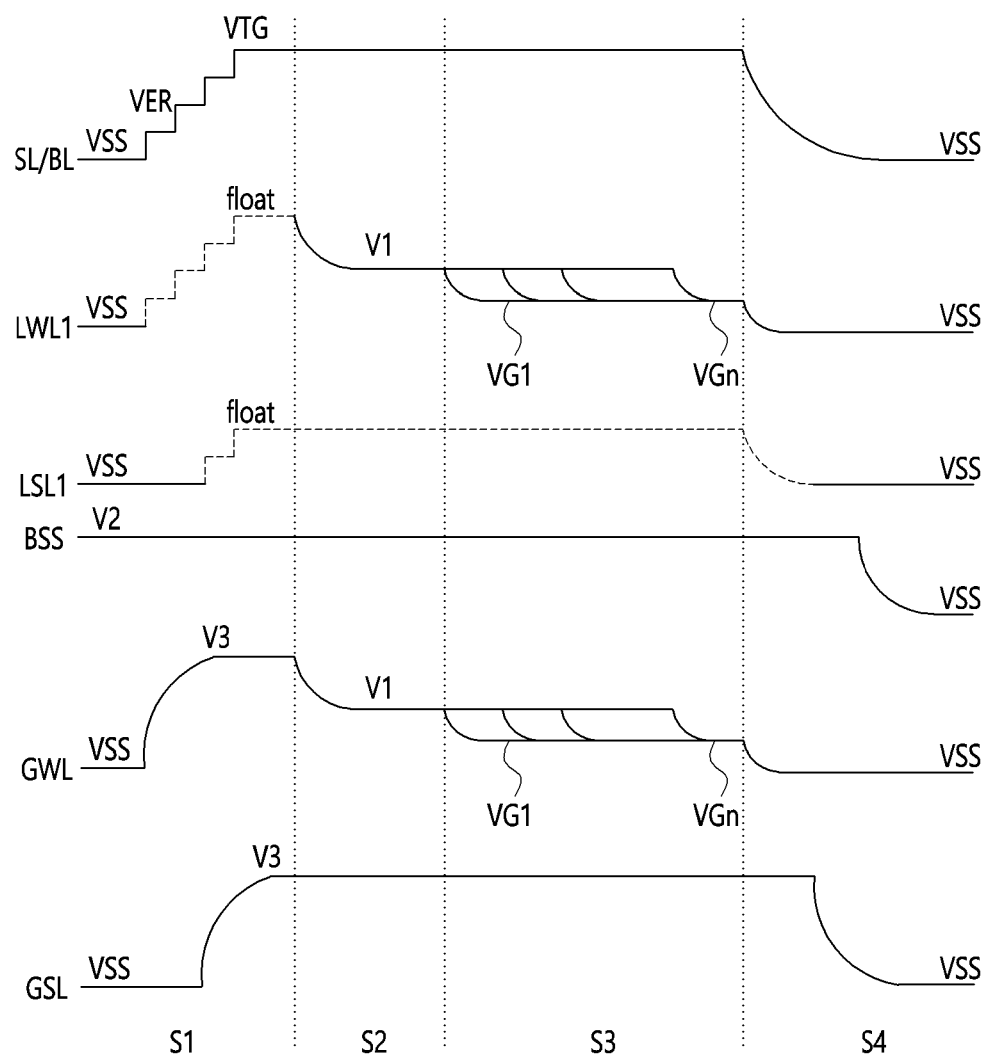
FIG. 5 is a timing diagram for describing an erase operation on a target memory block in accordance with an embodiment of the present disclosure.

FIG. 5 is a timing diagram for describing an erase operation on the target memory block MB1 in accordance with an embodiment of the present disclosure.

Referring to FIGS. 1 to 5, the erase operation on the target memory block MB1 may include operations from a first period S1 to a fourth period S4.

In the first period S1, a ground voltage VSS may be applied to the global select lines GSL and the local select lines LSL1, and accordingly, select transistors (i.e., the drain select transistor DST and the source select transistor SST) coupled to the local select lines LSL1 may be turned off. The ground voltage VSS may also be applied to the global word lines GWL and the local word lines LWL1.

The block select signal BSS corresponding to the target memory block MB1 may be enabled as the second voltage V2.

The erase operation may be performed by applying the erase voltage VER to the source line SL which is coupled to the target memory block MB1, according to a gate-induced drain leakage (GIDL) effect. In more detail, bit lines BL (i.e., bit lines BL1 to BLm) which are coupled to the target memory block MB1 by coupling capacitors may be boosted with the erase voltage VER. The erase voltage VER may gradually rise, and after reaching a target level VTG, may be maintained during the second period S2 and the third period S3. When the voltage levels of the bit lines BL and the source line SL rise in the state in which the drain select transistor DST and the source select transistor SST are turned off, gate-induced drain leakage (GIDL) current flows in the direction of channels, and hot holes generated in the select transistors flow in the direction of the channels, by which the voltages of the channels may rise to the erase voltage VER.

During a period in which the erase voltage VER rises to the target level VTG, that is, during the rising period of the erase voltage VER, the third voltage V3 may be applied to the global word lines GWL and the global select lines GSL. For example, the third voltage V3 may be sequentially applied to the global word lines GWL and the global select lines GSL. However, the application sequence of the third voltage V3 is not limited thereto. The global select lines GSL may be continuously applied with the third voltage V3 until the erase voltage VER is discharged to the ground voltage VSS in the fourth period S4.

The third voltage V3 may be a voltage higher than the second voltage V2 which is applied as the block select signal BSS, and accordingly, the local word lines LWL1 and the local select lines LSL1 may be floated. For example, as the third voltage V3 is sequentially applied to the global word lines GWL and the global select lines GSL, the local word lines LWL1 and the local select lines LSL1 may be sequentially floated. However, a floating sequence is not limited thereto. When the level of the erase voltage VER gradually rises, the voltage levels of the local word lines LWL1 and the local select lines LSL1 may also rise due to a coupling effect.

The local select lines LSL1 may continuously maintain the floated state while the third voltage V3 is applied to the global select lines GSL.

Accordingly, even though the rising period of the erase voltage VER is repeated as the interruption and resumption of the erase operation are repeated, the memory cells may not be erased at all because the local word lines LWL1 are floated. Namely, even though the rising period of the erase voltage VER is repeated, uneven erasure of the memory cells may be prevented.

In the second period S2, the first voltage V1 may be applied to the global word lines GWL and the local word lines LWL1. The capacitance of the first voltage V1 may be larger than the capacitance of each of the first to nth group voltages VG1 to VGn. Accordingly, even when the first voltage V1 is applied to the local word lines LWL1 and the local select lines LSL1 which are floated at a high voltage level, the first voltage V1 may be stably supplied.

In the third period S3, the first to nth group voltages VG1 to VGn may be sequentially applied to the first to nth local word line groups LWL1_G1 to LWL1_Gn. In more detail, the first group voltage VG1 may be applied to the first global word line group GWL1_G1 and the first local word line group LWL1_G1, and then, the second group voltage VG2 may be applied to the second global word line group GWL1_G2 and the second local word line group LWL1_G2. In this way, the nth group voltage VGn may be lastly applied to the nth global word line group GWL1_Gn and the nth local word line group LWL1_Gn.

As illustrated, the first to nth group voltages VG1 to VGn may be the same, and according to an embodiment, the first to nth group voltages VG1 to VGn may be different from each other.

According to an embodiment, the application sequence of the first to nth group voltages VG1 to VGn may be different than the illustrated one.

Accordingly, as the first to nth group voltages VG1 to VGn, which are much lower than the target level VTG, are applied to the first to nth local word line groups LWL1_G1 to LWL1_Gn, the memory cells of the target memory block MB1 may be erased.

In the fourth period S4, the bit lines BL, the local word lines LWL1 and the global word lines GWL may be discharged to the ground voltage VSS. After the bit lines BL, the local word lines LWL1 and the global word lines GWL are discharged to the ground voltage VSS, the global select lines GSL may be discharged to the ground voltage VSS. When the global select lines GSL are discharged to the ground voltage VSS, the ground voltage VSS may be applied to the local select lines LSL1. Thereafter, the block select signal BSS may be disabled to the ground voltage VSS.

According to an embodiment, when the target memory block MB1 further includes one or more dummy local word lines, the dummy local word lines may be controlled similarly to the local select lines LSL1.

According to the present disclosure, the local word lines LWL1 are floated during the first period S1 in which the erase voltage VER rises, and accordingly, the uneven erasure of memory cells may be prevented despite the repetition of the interruption and resumption of the erase operation. Moreover, by first applying the more stable first voltage V1 to the floated local word lines LWL1 in the second period S2 before applying the first to nth group voltages VG1 to VGn in the third period S3 for actual erasure, the erase operation may be more stably performed.

FIG. 6 is a flowchart illustrating a method for the memory device 10 to perform an erase operation in accordance with an embodiment of the present disclosure.

Referring to FIGS. 1 to 6, at operation S110, the peripheral circuit 100 may float the local word lines LWL1 which are coupled to the target memory block MB1, during the rising period of the erase voltage VER. In detail, in order to float the local word lines LWL1, the peripheral circuit 100 may apply the second voltage V2 as the block select signal BSS corresponding to the target memory block MB1, and may apply the third voltage V3 to the global word lines GWL. The second voltage V2 may be lower than the third voltage V3. When the local word lines LWL1 are floated, the peripheral circuit 100 may also float the local select lines LSL1 which are coupled to the target memory block MB1.

At operation S120, after the rising period, the peripheral circuit 100 may apply the first voltage V1 to the local word lines LWL1. The capacitance of the first voltage V1 may be larger than the capacitance of each of the first to nth group voltages VG1 to VGn. The first voltage V1 may be higher than the first to nth group voltages VG1 to VGn. The first voltage V1 may be lower than the second voltage V2 and the third voltage V3.

At operation S130, the peripheral circuit 100 may apply the first to nth group voltages VG1 to VGn to the local word lines LWL1. In detail, the peripheral circuit 100 may sequentially apply the first to nth group voltages VG1 to VGn to the first to nth local word line groups LWL1_G1 to LWL1_Gn. As the first to nth group voltages VG1 to VGn are applied to the local word lines LWL1, the memory cells of the target memory block MB1 may be substantially erased.

Those skilled in the art to which the present disclosure pertains will understand that the present disclosure may be implemented in other detailed forms without changing the technical spirit or essential characteristics of the present disclosure. Accordingly, the aforementioned embodiments should not be construed as being limitative, but should be construed as being only illustrative from all aspects. The scope of the present disclosure is disclosed in the appended claims rather than the detailed description, and it should be understood that all modifications or variations derived from the meanings and scope of the present disclosure and equivalents thereof are included in the scope of the appended claims. Furthermore, the embodiments may be combined to form additional embodiments.

What is claimed is:

1. A memory device comprising:
a target memory block on which an erase operation is to be performed; and
a peripheral circuit,
wherein
the peripheral circuit, during the erase operation, floats local word lines which are coupled to the target memory block while the erase voltage rises toward a target level,
the peripheral circuit, during the erase operation and after an erase voltage reached the target level, applies a first voltage to the local word lines, and
the peripheral circuit, during the erase operation and after application of the first voltage to the local word lines, applies one or more group voltages to the local word lines.

2. The memory device according to claim 1, wherein the first voltage is higher than each of the one or more group voltages.

3. The memory device according to claim 1, wherein the peripheral circuit floats the local word lines by applying a second voltage as a block select signal corresponding to the target memory block, and applying a third voltage to global word lines which are configured to be coupled to the local word lines in response to the block select signal.

4. The memory device according to claim 3, wherein the second voltage is lower than the third voltage.

5. The memory device according to claim 3, wherein the first voltage is lower than the second voltage and the third voltage.

6. The memory device according to claim 1, wherein the peripheral circuit applies the one or more group voltages to respective local word line groups, into which the local word lines are grouped.

7. The memory device according to claim 1, wherein the peripheral circuit floats, when floating the local word lines, local select lines which are coupled to the target memory block.

8. The memory device according to claim 7, wherein the peripheral circuit keeps the local select lines floated during the applying of the first voltage and the one or more group voltages.

9. A method for operating a memory device, comprising:
floating local word lines which are coupled to a target memory block on which an erase operation is being performed, during a rising period of an erase voltage;
during the erase operation and after the rising period of the erase voltage, applying a first voltage to the local word lines; and
during the erase operation and after applying the first voltage to the local word lines, applying one or more group voltages to the local word lines.

10. The method according to claim 9, wherein the first voltage is higher than the one or more group voltages.

11. The method according to claim 9, wherein the floating of the local word lines comprises:
applying a second voltage as a block select signal corresponding to the target memory block; and
applying a third voltage to global word lines which are configured to be coupled to the local word lines in response to the block select signal.

12. The method according to claim 11, wherein the second voltage is lower than the third voltage.

13. The method according to claim 11, wherein the first voltage is lower than the second voltage and the third voltage.

14. The method according to claim 9, wherein the one or more group voltages are applied to respective local word line groups, into which the local word lines are grouped.

15. The method according to claim 9, further comprising:
floating, during the floating of the local word lines, local select lines which are coupled to the target memory block; and,
keeping the local select lines floated during the applying of the first voltage and the one or more group voltages.

* * * * *